United States Patent [19]

Pass

[11] 4,107,619
[45] Aug. 15, 1978

[54] CONSTANT VOLTAGE - CONSTANT CURRENT HIGH FIDELITY AMPLIFIER

[75] Inventor: Nelson S. Pass, Sacramento, Calif.

[73] Assignee: Threshold Corporation, Sacramento, Calif.

[21] Appl. No.: 862,406

[22] Filed: Dec. 20, 1977

[51] Int. Cl.² .................................. H03F 3/45
[52] U.S. Cl. ...................... 330/255; 330/149; 330/151; 330/261; 330/311
[58] Field of Search ............. 330/84, 149, 151, 252, 330/255, 261, 310, 311; 179/1 A

[56] References Cited

U.S. PATENT DOCUMENTS 3,970,953  7/1976  Walker et al. .............. 330/151 X

FOREIGN PATENT DOCUMENTS 1,214,733  4/1966  Fed. Rep. of Germany ........... 330/252

Primary Examiner—James B. Mullins
Attorney, Agent, or Firm—Thomas Schneck, Jr.

[57] ABSTRACT

A transistor amplifier in which collector to emitter voltages and currents are kept constant, particularly in the power output stages of the amplifying devices for minimizing distortion due to changes in the transistor beta, the essential form of distortion in amplifiers. High fidelity low power output current from a cascoded transistor amplifier is fed through a load to a second, high power, amplifier having constant current and less than unity gain, with an output summed with the output of the first amplifier such that the output of the first low power amplifier is the signal bearing portion and the output of the second amplifier serves as a current bootstrap, increasing the effective impedance of the load as seen by the first amplifier.

11 Claims, 2 Drawing Figures

CONSTANT VOLTAGE - CONSTANT CURRENT HIGH FIDELITY AMPLIFIER

BACKGROUND OF THE INVENTION a. Field of the Invention.

The invention relates to transistor amplifiers and, more particularly, to a high fidelity, transistor audio power amplifier.

b. Prior Art.

Lowering distortion in transistor power amplifier circuits without comprising their transient response remains a primary problem in high fidelity audio systems. Until fairly recently, a typical technique for removing distortion components in linear amplifiers was to cascade many gain stages to form a circuit having enormous amounts of gain and then using negative feedback to control the system and correct for the many errors introduced by the large number of components.

While the sum of the distortions of these components may cause large complex nonlinearities, the correspondingly large amounts of feedback applied are generally more than equal to the task of cleaning up the performance with only one trade off; the high frequency performance of the system. Because each amplifying device also contributes its own high frequency rolloff, and because the sum of many of these rolloffs creates a complex, multi-pole phase lag, a system using large amounts of negative feedback tends to be unstable at high frequencies, resulting in phenomena popularly referred to as transient intermodulation distortion (TIM). There are two main prior art approaches to TIM reduction. The first prior art approach is to not require any high frequency performance of the circuit; that is, not to feed it high frequency signals that it cannot handle. While this solution works very well for many operational amplifier applications requiring only low frequency performance, it is judged to be unacceptable in high fidelity applications where high voltage frequency response is required beyond 100 kilohertz.

The second prior art approach involves simple circuits having few amplifying devices and low open loop gain. The simplicity and low gain allows the circuitry to respond to signals very quickly, thus eliminating transient problems, but does so at the expense of higher simple harmonic and intermodulation distortions. While not as offensive as TIM, these distortions present another problem and another approach is needed.

Previously, cascode circuit operation has been employed in high fidelity pre-amplifier, signal processing circuits and elsewhere. The reverse open-circuit amplification parameter is very much smaller for transistors connected in cascode than for a single common emitter stage, thereby yielding good stability for the circuit. A discussion of transistor cascode operation, including a model of the circuit may be found in the book "Electronic Devices and Circuits" by Millman and Halkias, McGraw-Hill, 1967, p. 355-357. Although cascode operation has been tried in portions of amplifiers, no known amplifier has utilized cascode operation through to the output stage.

SUMMARY OF THE INVENTION

Distortion, in the dynamic sense, arises when the gain of an amplifying device is altered. However, the gain of a device changes as the voltage across and current through the device changes. As these conditions fluctuate, the device generates distortion.

The approach of the present invention has been to devise a transistor power amplifier with nearly constant voltage, constant current across and through the device, respectively. Voltage is controlled by using a common base transistor having a constant voltage source connected between its base and a reference line, with the common base transistor having its emitter connected to the collector of a common emitter or common collector transistor, with the emitter of the latter connected to the same reference line. This circuit configuration is a cascode connection which is used in gain stages and output stages of the present transistor amplifier for maintaining a constant voltage.

A second aspect of the transistor amplifier of the present invention involves pulling a constant amount of current through the amplifier output. This is achieved by employing the current output of a first low power amplifier having a relatively distortion free, voltage stabilized signal, as described above as the signal bearing portion of a larger constant current amplifier. Current from the low power amplifier is fed through a load to a second, high power amplifier of constant current output and gain less than unity. The second amplifier is maintained outside of the feedback loop of the first amplifier but the currents of the two are summed, so that the second amplifier does the greater amount of work through the load, but the sonic quality from the load is derived from the first amplifier. By maintaining nearly constant current through the load and constant voltage across the amplifier, distortion may be reduced by 10-30 times.

DESCRIPTION OF THE PREFERRED EMBODIMENT

Figure 1:
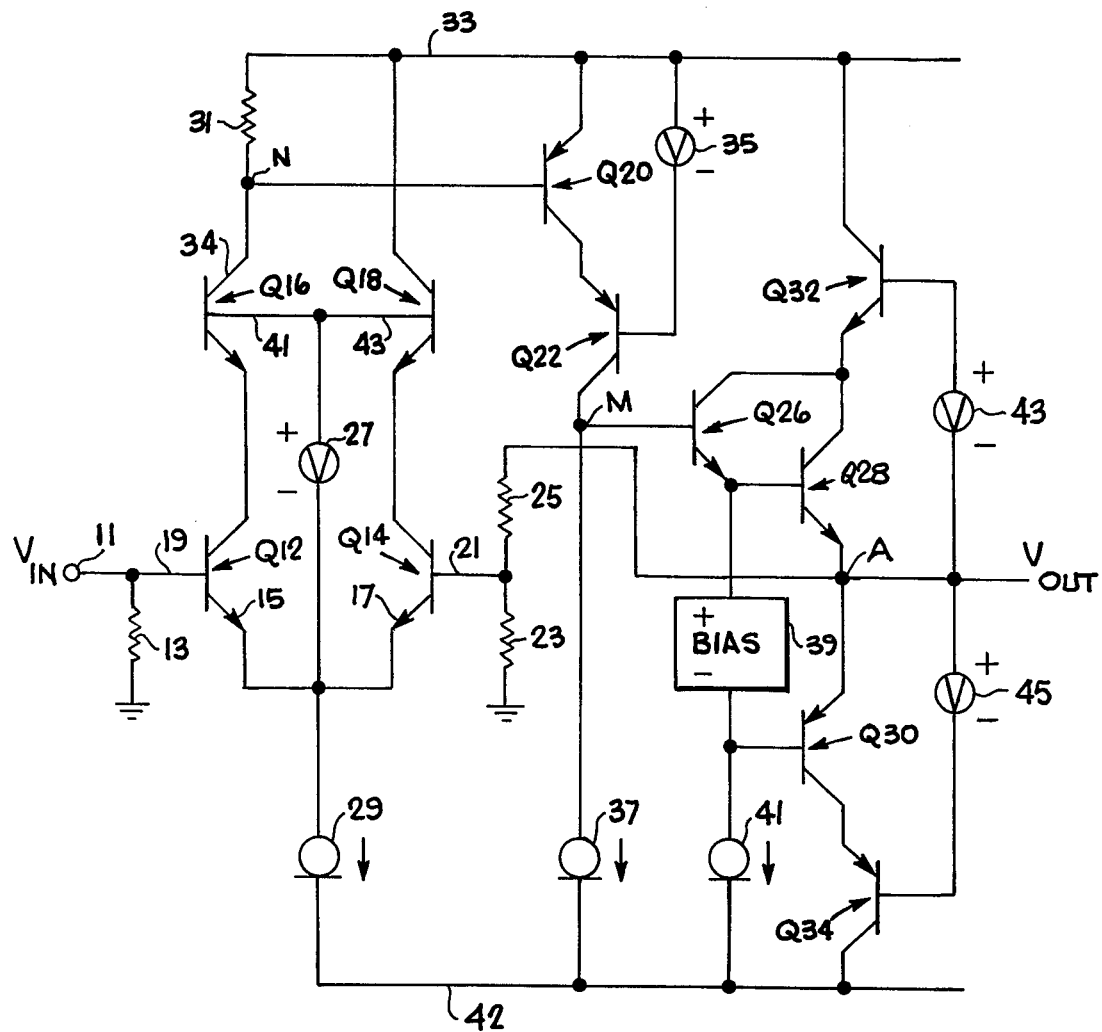
FIG. 1 is a simplified electrical schematic of a transistor power amplifier of the present invention with constant voltage thereacross.

FIG. 1 shows a transistor power amplifier which substantially removes voltage dependent distortion. An input signal to be amplified, $V_{in}$, is applied to the terminal 11 from which a resistor 13 is connected to ground. The input signal is developed across resistor 13 for presentation to a transistor input stage comprising the differential input pair Q12, Q14. The differential input pair has emitters 15, 17 connected together with transistor 15 receiving the input signal, $V_{in}$ on base electrode 19. The base 21 of the transistor Q14 is connected between two resistors 23, 25 for referencing to the output signal with which amplification of the input signal is referenced in the differential input pair.

Transistors Q16, Q18 are common base transistors connected to respective common emitter transistors Q12, Q14, thereby forming a pair of cascode connections. In other words, transistor Q16 is connected in cascode with transistor Q12 while transistor Q18 is connected in cascode with transistor Q14. A constant voltage source 27 is connected between the common bases, 41, 43 of transistors Q16, Q18 and the common emitters, 15, 17 of transistors Q12, Q14, respectively. A first constant current source 29 is connected from the common emitters 15, 17 to ground. It will be seen that the constant voltage source 27 maintains a constant collector emitter voltage across transistors Q12, Q14.

Thus, distortion due to voltage fluctuations of the differential input pair are eliminated. A bias resistor 31 is connected to the collector 34 of transistor Q16. Thus, the transistors Q12, Q14, Q16, Q18 form a transistor input stage with a signal input terminal 11 and a low level signal output node N.

Although the differential input stage utilizing transistors Q12 in cascode with transistor Q16 and Q14 in cascode with transistor Q18 form a differential input pair, such a differential input pair connected in cascode is not necessary in the present invention because the signals being amplified are low level signals. The present invention teaches cascode connections for high power amplification stages. Nevertheless, it is preferable to use the cascode connections to minimize distortion even in the input stages.

Transistor Q20 is a common emitter gain stage having a base connected to one end of resistor 31 and an emitter connected to the common positive voltage line 33. Resistor 31 helps develop forward bias between the emitter and base of transistor Q20. The collector of transistor Q20 is connected to the emitter of transistor Q22, a common base transistor having a constant voltage source 35 connected between the base of transistor Q22 and the positive voltage line 33. The connection of transistor Q20 to Q22 is a cascode connection wherein the constant voltage source 35 maintains a constant collector emitter voltage across transistor Q20.

The amplification taken from the transistor gain stage formed by transistors Q20 and Q22 is taken from the collector of transistor Q22 at node M, an intermediate signal output node. These two transistors together form a transistor voltage gain stage. A constant current source 37 is connected to the collector of transistor Q22.

Some of the current from the collector of transistor Q22 is base current for transistor Q26 which is part of a final power amplifier. Transistor Q26 has a bias supply 39 connected to its emitter, as well as a constant current source 41. Transistors Q28 and Q30 are both connected to the emitter of transistor Q26 with transistor Q28 being directly connected and transistor Q30 being connected on the opposite side of the bias supply 39. The transistors Q28 and Q30 are of opposite polarity with the emitters of each connected at node A. Such a balanced design is especially useful in push-pull amplifiers which are customarily operated in class AB mode.

Transistors Q28 and Q30 have their collector-emitter voltages stabilized by a constant voltage source. Transistor Q28 is stabilized by a voltage source 43 having one side connected to the base of transistor Q32 which in turn has its emitter connected to the collector of transistor Q28. The other side of voltage source 43 is connected to node A. Transistor Q32 has its collector tied to the positive line 33. The transistors Q28 and Q32 form a cascode connection.

Similarly, constant voltage supply 45 is connected on one side to node A and on the other side to the base of transistor Q34. Transistor Q34 has its emitter connected to the collector of transistor Q30 and its own collector connected to the common negative line 42. Transistor Q30 has its emitter connected to node A so that the common base transistor Q34 is connected in cascode with the common emitter transistor Q30. This combination, using the constant voltage supply 45 freezes the collector-emitter voltage across transistor Q30, just as the collector-emitter voltage is frozen across transistor Q28 by the cascode connection using the constant voltage source 43.

It is not essential that the output stage be operated in the common emitter connection as shown, since a common collector mode would work equally well as long as another transistor in the common base mode is connected to the output electrode of the gain transistor such that a constant voltage source is applied across the collector-emitter electrodes of the gain transistor to freeze the voltage thereacross. Having unity current gain, extremely wide band width, and very little distortion, the common base transistor shields the gain transistor from voltage changes in the circuit. The output signal is taken at node A.

The positive and negative voltages applied on lines 33 and 42 are typically positive and negative supply voltages which are typically nine volts positive and nine volts negative, although these voltages will depend on the types of transistors selected and manufacturer's specifications. Similarly, the value of the constant voltage supplies 43, 45 and the constant current sources 29, 37 and 41 are selected to be values which stabilize the operation of each stage, as described. The constant current sources 29, 37 and 41 may be field effect transistors with connected gate and source or constant current sinking transistors. An output load is connected to the terminal $V_{out}$ which is connected to node A, a final signal output node which develops a nominal amount of output current, typically less than one amp. The circuit of FIG. 1 is thus voltage stabilized and eliminates voltage dependent nonlinearities, thereby allowing input signals to swing up to peak amplitude much more cleanly than in an unstabilized amplifier.

Figure 2:
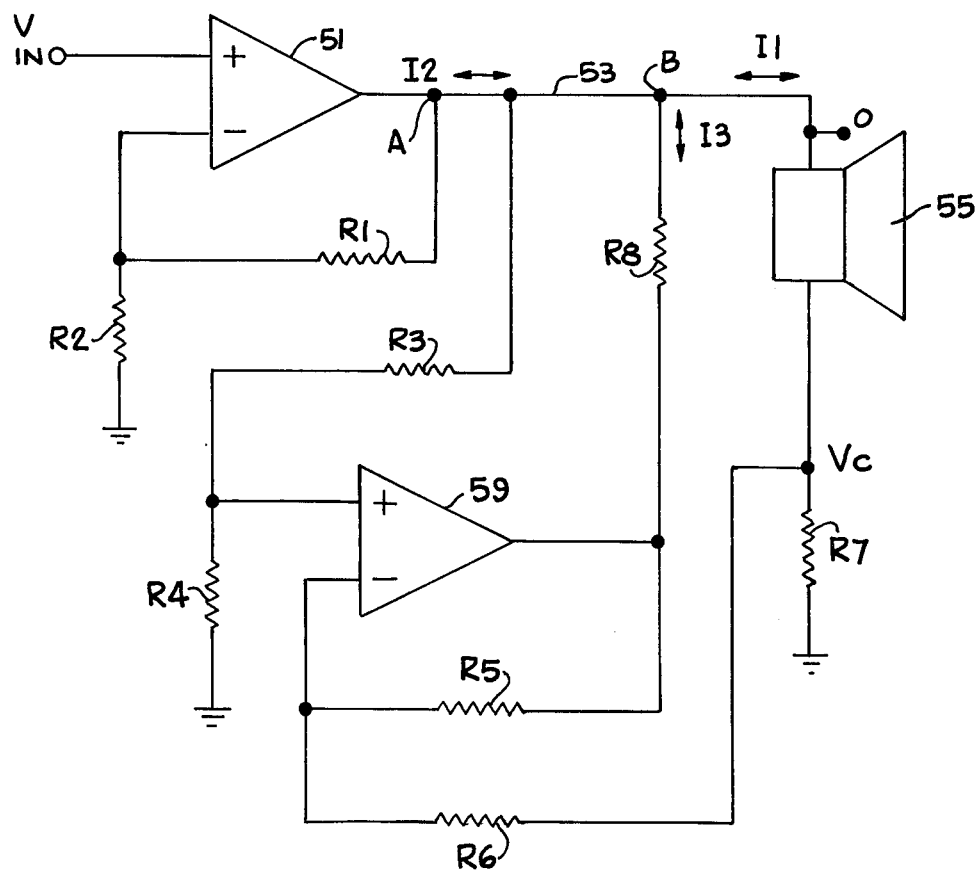
FIG. 2 is an electrical plan of a transistor power amplifier of the present invention with constant current therethrough.

In FIG. 2, the amplifier of FIG. 1 is represented by the class A amplifier 51. Amplifier 51 is a low power relatively distortion free amplifier having output current taken along line 53 and fed to load 55 which is shown to be a speaker. The opposite terminal of the speaker is connected to a current sensing resistor R7 which develops a voltage thereacross which serves as an input signal for the larger amplifier 59. The amplifier 59 has a high output impedance and a current output which is significantly greater than amplifier 51. For example, a 10 to 1 current ratio would be preferable.

Amplifier 59 can be a conventional high power operational amplifier whose input and feedback connections serve to make it operate as a power current source, having as high an output impedance as possible, with a gain factor such that the output current is between 90–99% of the current through the load. The voltage at the output of amplifier 59 is determined primarily by amplifier 51, and is not directly dependent upon the current output of amplifier 59. In other words, amplifier 59 is kept substantially out of the feedback loop of amplifier 51.

The effect of this circuit arrangement is that amplifier 59 provides large amounts of current to load 55, while the amplifier 51 supplies the signal-bearing portion of the current to load 55.

The benefit of this arrangement is that amplifier 59 need not be a high fidelity amplifier. It may be any type of power amplifier which supplies large amounts of current. The current output from amplifier 59 is added with the current output from amplifier 51 at node B and the sum of the currents is fed to the load. This technique is a "current bootstrap" for driving an audio load, such as a speaker with large amounts of current, yet with a sonic output which is derived from a high fidelity amplifier driving an effectively high impedance load.

Amplifier 59 has a current gain slightly less than unity and is connected in the loop between the final signal output node of amplifier 51 and the speaker load 55. The amplifier senses the nominal or low current of amplifier 51 through the resistor R7 and sources ten to twenty times, or perhaps even a higher multiplier, of the nominal current present at the final output node. The sourced current is then summed with the output current which is the final signal of amplifier 51.

With reference to FIG. 2, it will be seen that the cascode Class A amplifier 51 has a resistor R1 connected in its feedback loop to the negative input side of the amplifier and a ground connection from the negative side through resistor R2. These resistors establish the voltage gain of amplifier 51 to be R1+R2/R2. In terms of output voltage at node A, $V_A$:

$$V_A = V_{IN}[(R1+R2)/R2]$$

where $V_{IN}$ is the input voltage to the positive input side of the amplifier.

Amplifier 59 is an operational amplifier which acts as a bilateral current source providing a current bootstrap for amplifier 51, by multiplying the effective impedance of the load 55, $R_L$, by the currents I3/I2 as seen from node A. Effectively, this increases the efficiency of the class A cascode amplifier 51 because the overall configuration acts as a class A amplifier, yet the output stage bias current is less than for a regular class A by a factor which may be as large as I2/I3.

It will be seen that amplifier 59 has a positive input from node A through resistor R3. A bias resistor R4 is connected from ground to an end of resistor R3 which connects to the positive input side of amplifier 59.

The ground side of speaker 55 is connected to ground through current sensing resistor R7 and to the negative input side of amplifier 59 through resistor R6. The negative input side of amplifier 59 is connected through resistor R5 to the output of amplifier 59, thereby forming a feedback loop. The output of amplifier 59 is also connected through resistor R8 to the positive side of the load, speaker 55. Current through resistor R8 is bilateral current I3 which combines with bilateral current I2 for yielding the total load current I1. As mentioned previously, the current I3 from amplifier 59 is very much greater than the current from the cascode class A amplifier 51. The resistor R6 is very much greater than the current sensing resistor R7. Current resistor R7, in turn, is very much smaller than the load resistance. For example, if the resistance of load 55 is 8 ohms, the current of current sensing resistor R7 would typically be approximately 0.1 ohm, although these values are not critical. Similarly, the resistive value of load 55 is very much greater than the resistance of resistor R8 and R8 is very much less than R5 plus R6. Resistor R6 is made equal to resistor R4 and resistor R5 is made equal to resistor R6 plus resistor R7 so that the output impedance of the amplifier of FIG. 2 can be shown to be:

$$R_{OUT} \cong R_8 (R/\Delta R)$$

where $R$ is the order of magnitude value of R3, R4, R5 and R6 and $\Delta R$ is the matching tolerance of resistors R4, R5, R6.

The purpose of the current bootstrap provided by amplifier 59 is to modify the load condition seen by amplifier 51 in such a way that amplifier 51 may be operated at nearly constant current. Previously in this patent application, it was described how amplifier 51 maintained cascode operation in its power stages, so that now output currents and voltages are maintained at constant values eliminating beta transconductance fluctuations induced by voltage and current changes. These fluctuations are the primary and dominant distortion found in amplifying systems.

Because resistor matching is used to achieve a high value for the output impedance of the system, the action of the current source performed by amplifier 59 does not effect the output voltage at output node O. While the current output of amplifier 59, which is operated in the Class AB mode, has some finite amount of distortion, the output node O is included in the feedback loop of amplifier 59, essentially reducing the distortion of the system to the performance of the lower power amplifier 51, where the amplifying devices can be held at as nearly constant voltage and constant current levels as possible.

The amount of current generated in amplifier 51 is just enough to keep it in Class A operation, typically less than one amp. Amplifier 59 is maintained at slightly less than unity gain, e.g. 0.95. Thus, for every 20 amps through the load, amplifier 59 contributes 19 amp. As the amplifier gain approaches unity, its current contribution increases. Unity gain or higher is to be avoided because instabilities may develop.

In this patent application, the variations of beta have been described with reference to a transistor amplifier. However, those skilled in the art will realize that the same effect occurs in tubes and field effect transistors where transconductance is even more of a function of voltage than in transistors. Thus, the inventive concept disclosed herein should not be limited to transistors but should be extended to other amplifying devices such as vacuum tubes and field effect transistors.

What is claimed is:

1. A high fidelity audio amplifier comprising,
a transistor input stage having a signal input terminal and a low level signal output node,
a transistor voltage gain stage having first and second transistors connected in cascode with a first constant voltage source means in parallel therewith for producing a constant $V_{CE}$ drop in said first transistor, said transistor voltage gain stage connected to said low level signal output node and having an intermediate signal output node and
a transistor power amplifier stage having third and fourth transistors connected in cascode with a second constant voltage source means in parallel therewith for producing a constant $V_{CE}$ drop in said third transistor, said transistor power amplifier stage connected to said intermediate signal output node and having a final signal output node wherein a nominal amount of output current is delivered.

2. The audio amplifier of claim 1 wherein said transistor input stage comprises fifth and sixth transistors connected in cascode with a third constant voltage source means in parallel therewith for producing a constant $V_{CE}$ drop in said fifth transistor.

3. The audio amplifier of claim 1 wherein said transistor voltage gain stage comprises a first transistor arranged in a common emitter configuration connected in cascode to a second transistor arranged in a common base configuration.

4. The audio amplifier of claim 1 wherein said transistor power amplifier comprises a pair of third transistors, each member of the pair connected in cascode to one of a pair of fourth transistors, each arranged in a common base configuration.

5. The apparatus of claim 4 wherein one of said pair of third transistors is a Darlington pair.

6. The apparatus of claim 1 wherein a load is connected to said final signal output node and a current source amplifier is connected in a loop between said final signal output node and said load, said current source amplifier having means for sensing the nominal current of said final signal output node and sourcing $n$ times the nominal current at said final signal output node for summing the sourced current with said final signal output current.

7. The apparatus of claim 6 wherein $n$ is greater than 5.

8. The apparatus of claim 6 wherein said current sensing means is a resistor.

9. A high fidelity amplifier comprising,
a solid state Class A amplifier having an input node and an output node, said Class A amplifier delivering a nominal current in a given voltage range to said output node
a speaker having a first terminal connected to said output node, and
a solid state current source having an input and an output, said input connected to a second terminal of the speaker and said output connected to the output node of the Class A amplifier, said current source having means for sensing said nominal current of the Class A amplifier and sourcing $n$ times said nominal current tracking said given voltage range, where $n$ is a number greater than one, whereby said nominal current and $n$ times the nominal current are summed at said output node for delivery to said speaker.

10. The apparatus of claim 9 wherein said current sensing means is a resistor.

11. A high fidelity audio amplifier comprising,
a transistor voltage gain stage having at least first and second transistors connected in cascode with a first constant voltage source means in parallel therewith for producing a constant $V_{CE}$ drop in said first transistor, said first transistor arranged in a common emitter configuration and said second transistor arranged in a common base configuration and having an intermediate signal output node,
a transistor power amplifier stage having third and fourth transistors connected in cascode, having a second constant voltage source means in parallel therewith for producing a constant $V_{CE}$ drop in said third transistor, said transistor power amplifier stage connected to said intermediate signal output node and having a final signal output node wherein a nominal amount of output current is delivered within a given voltage range,
a transistor input stage having a differential input pair of transistors symmetrically connected in cascode to a pair of input amplifier transistors each arranged in a common base configuration with a third constant voltage source means in parallel with said differential input and input amplifier transistor pairs for producing a constant $V_{CE}$ drop in said differential input pair of transistors, said transistor input stage having a signal input terminal and a low level signal output node, said transistor voltage gain stage connected to said low level signal output node,
a speaker having a first terminal connected to said output node, and
a solid state current source having an input and an output, said input connected to a second terminal of the speaker and said output connected to said final signal output node, said current source having means for sensing said nominal current and sourcing $n$ times said nominal current tracking said given voltage range, where $n$ is a number greater than one, whereby said nominal current and $n$ times the nominal current are summed at said output node for delivery to said speaker.

* * * * *